United States Patent
Fujimoto

(10) Patent No.: US 8,286,874 B2
(45) Date of Patent: Oct. 16, 2012

(54) CARD AND HOST DEVICE

(75) Inventor: Akihisa Fujimoto, Fussa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/422,916

(22) Filed: Mar. 16, 2012

(65) Prior Publication Data

US 2012/0176855 A1 Jul. 12, 2012

Related U.S. Application Data

(63) Continuation of application No. 13/010,346, filed on Jan. 20, 2011, now Pat. No. 8,162,216, which is a continuation of application No. 12/861,114, filed on Aug. 23, 2010, now Pat. No. 7,891,566, which is a continuation of application No. 12/468,886, filed on May 20, 2009, now Pat. No. 7,810,727, which is a continuation of application No. 12/043,005, filed on Mar. 5, 2008, now Pat. No. 7,549,580, which is a continuation of application No. 11/553,002, filed on Oct. 26, 2006, now Pat. No. 7,353,993, and a continuation of application No. PCT/JP2005/021689, filed on Nov. 25, 2005.

(30) Foreign Application Priority Data

Nov. 26, 2004 (WO) ............... PCT/JP2004/017627

(51) Int. Cl.
*G06K 7/06* (2006.01)
(52) U.S. Cl. .................................. 235/441; 235/492
(58) Field of Classification Search ............. 235/441, 235/492
See application file for complete search history.

(56) References Cited

U.S. PATENT DOCUMENTS

| | | | |
|---|---|---|---|
| 4,827,109 A | 5/1989 | Matsumoto et al. |
| 6,266,725 B1 | 7/2001 | Deveaud |
| 6,279,114 B1 | 8/2001 | Toombs et al. |
| 6,364,208 B1 | 4/2002 | Stanford et al. |
| 6,418,501 B1 | 7/2002 | Gama et al. |
| 7,044,385 B2 | 5/2006 | Kang |

(Continued)

FOREIGN PATENT DOCUMENTS

JP    63-261489 A    10/1988

(Continued)

OTHER PUBLICATIONS

Japanese Office Action dated Jun. 8, 2010, Patent Application No. 2006-520560.

*Primary Examiner* — Kristy A Haupt
(74) *Attorney, Agent, or Firm* — Oblon, Spivak, McClelland, Maier & Neustadt, L.L.P.

(57) ABSTRACT

A host device is configured to read and write information from and into a card and to supply a supply voltage that belongs to a first voltage range or a second voltage range which is lower than the first voltage range, and issues a voltage identification command to the card. The voltage identification command includes a voltage range identification section, an error detection section, and a check pattern section. The voltage range identification section includes information indicating which one of the first voltage range and the second voltage range the supply voltage belongs. The error detection section has a pattern configured to enable the card which has received the voltage identification command to detect errors in the voltage identification command. The check pattern section has a preset pattern.

11 Claims, 7 Drawing Sheets

U.S. PATENT DOCUMENTS

| | | | |
|---|---|---|---|
| 7,891,566 B2 * | 2/2011 | Fujimoto | 235/441 |
| 8,162,216 B2 * | 4/2012 | Fujimoto | 235/441 |
| 2004/0107316 A1 | 6/2004 | Moro | |
| 2005/0132092 A1 | 6/2005 | Mylly et al. | |

FOREIGN PATENT DOCUMENTS

| | | |
|---|---|---|
| JP | 6-12537 | 1/1994 |
| JP | 6-223238 A | 8/1994 |
| JP | 7-134760 | 5/1995 |
| JP | 7-311820 | 11/1995 |
| JP | 09-179947 A | 7/1997 |
| JP | 9-282426 | 10/1997 |
| JP | 11-212887 A | 8/1999 |
| JP | 2000-010668 A | 1/2000 |
| JP | 2000-250661 | 9/2000 |
| JP | 2000-250665 A | 9/2000 |
| JP | 2002-109494 | 4/2002 |
| JP | 2004-86503 | 3/2004 |
| JP | 2004-086505 A | 3/2004 |
| TW | 199216 | 2/1993 |
| TW | 364102 | 7/1999 |
| WO | WO 02/054335 A2 | 7/2002 |

* cited by examiner

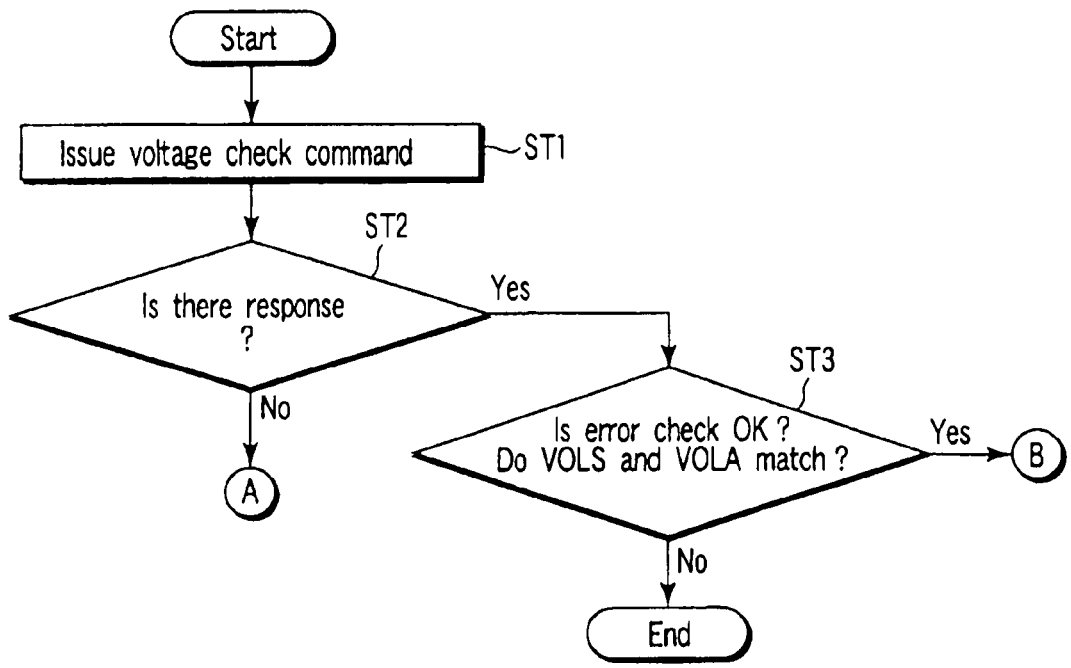
F I G. 6
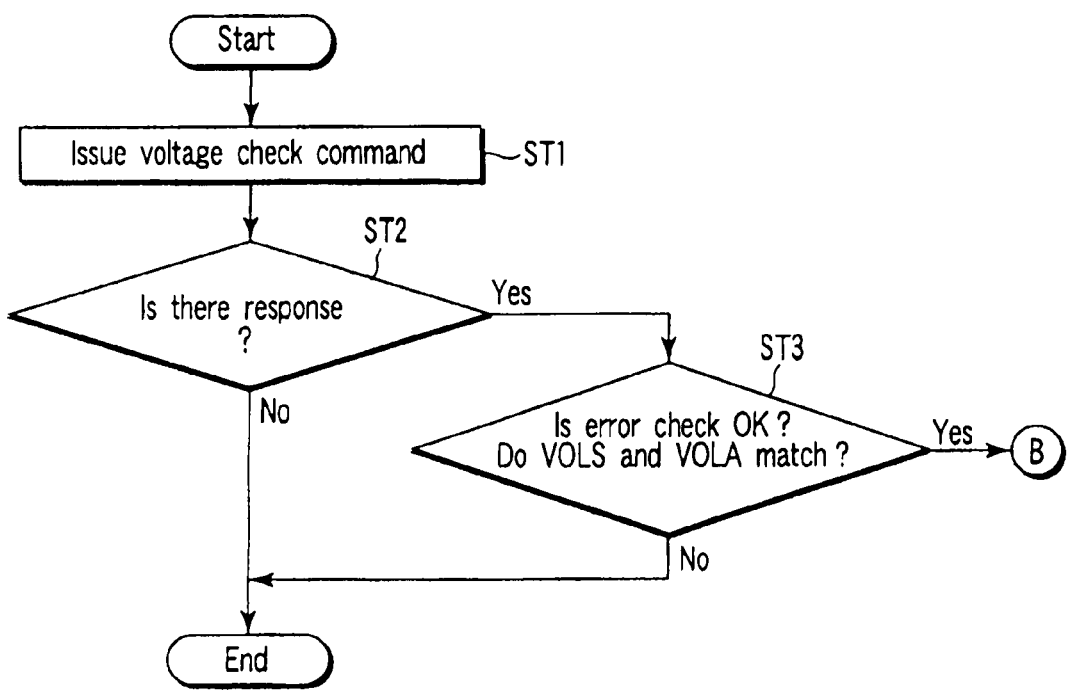
F I G. 7

CARD AND HOST DEVICE

CROSS-REFERENCE TO RELATED APPLICATIONS

This application is a Continuation Application of U.S. application Ser. No. 13/010,346, filed on Jan. 20, 2011, now issued as U.S. Pat. No. 8,162,216 on Apr. 24, 2012, which is a Continuation Application of U.S. application Ser. No. 12/861,114, filed on Aug. 23, 2010, now granted as U.S. Pat. No. 7,891,566, issued on Feb. 22, 2011, which is a Continuation Application of U.S. application Ser. No. 12/468,886, filed on May 20, 2009, now granted as U.S. Pat. No. 7,810,727 issued on Oct. 12, 2010, which is a Continuation Application of U.S. application Ser. No. 12/043,005, filed on Mar 5, 2008, now granted as U.S. Pat No. 7,549,580, issued on Jun. 23, 2009, which is a Continuation Application of U.S. application Ser. No. 11/553,002, filed on Oct. 26, 2006, now granted as U.S. Pat. No. 7,353,993, issued on Apr. 8, 2008, and is a Continuation Application of PCT Application No. PCT/JP2005/021689, filed on Nov. 25, 2005, which was published under PCT Article 21(2) in Japanese, and also claims priority to PCT/JP2004/017627, filed on Nov. 26, 2004. The entire contents of each of these documents are incorporated herein by reference.

BACKGROUND OF THE INVENTION

1. Field of the Invention

The present invention relates to a card and a host device, and relates, for example to checking of operating voltage and capacity of the memory card and host device.

2. Description of the Related Art

In recent years, a memory card, which is one type of removable storage device, has been heavily used in various portable electronic devices such as personal computers, PDAs, cameras, and mobile phones. PC cards and small-size SD (trademark) cards draw much attention as memory cards. The SD (trademark) card is a memory card which has a flash memory, a card controller and the like built-in, and is designed in particular to meet the demands of increased compactness, larger capacities and higher speeds.

Conventionally, an operating voltage of a memory card and its host device has been 3.3 V (high voltage) range and has supported a voltage range from 2.7 V to 3.6 V. Demand has arisen for operation with a lower voltage, for example, in 1.8 V (low voltage) range, in other words, which supports a voltage range of 1.65 V to 1.95 V, for example.

In addition, the capacity of a conventional memory card is not sufficient for storing large volumes of data, and a SD (trademark) card which store large volumes of data is desired.

BRIEF SUMMARY OF THE INVENTION

According to an aspect of the present invention, there is provided a host device configured to read and write information from and into a card and to supply a supply voltage that belong to a first voltage range or a second voltage range which is lower than the first voltage range, the host device configured to issue to the card a voltage identification command including a voltage range identification section, an error detection section, and a check pattern section, wherein the voltage range identification section includes information indicating which one of the first voltage range and the second voltage range the supply voltage belongs, the error detection section has a pattern configured to enable the card which has received the voltage identification command to detect errors in the voltage identification command, and the check pattern section has a preset pattern.

According to an aspect of the present invention, there is provided a card comprising a memory which stores information and a controller to control the memory, the card being operable at only a voltage that lies within a first voltage range, or at a voltage that lies within the first voltage range and a voltage that lies within a second voltage range which is lower than the first voltage range, and the card being supplied with a voltage identification command including a voltage range identification section, an error detection section, and a check pattern section, wherein, the card issues a response including a voltage range identification section and an error detection section or a check pattern section in response to the voltage identification command, the voltage range identification section of the response has the same pattern as the voltage range identification section of the voltage identification command, the error detection section of the response has a pattern configured to enable a device which has received the response to detect errors in the response, and the check pattern section of the response has the same pattern as the check pattern section of the voltage identification command.

BRIEF DESCRIPTION OF THE SEVERAL VIEWS OF THE DRAWING

FIG. 6 is a flowchart showing a process for checking an operating voltage range in the case where the host device operates in a high voltage range.

FIG. 7 is a flowchart of a process for checking an operating voltage range in the case where the host device operates in a low voltage range.

DETAILED DESCRIPTION OF THE INVENTION

Embodiments of the present invention will be described in the following with reference to the accompanying drawings. Note that the structural elements that have substantially the same function and configuration in the following description are assigned the same numbers, and repeated description is provided only when necessary.

(First Embodiment)

A first embodiment relates to reciprocal checking of an operating voltage range which a host device and a card support.

It is expected that when a card which can operate in low voltage is realized, a card that supports only high voltage operation (high voltage card), a card that supports high voltage and low voltage (dual-voltage card), and a host device that supplies low voltage and a host device that supplies high voltage exist in market.

As a result, when the host device that supplies low voltage (low voltage host device) and the high voltage card are used together, the following problems may arise. When a card is inserted into the host device, it is initialized by commands from the host device. At the initialization, the host device issues to the card commands for acquiring information in a register that stores information relating to operation conditions that is provided in the card. The host device can acquire information on the voltage supported by the card from the information.

When the information relating to the operation conditions is acquired, the high voltage card operates by a low voltage power supply that a host supplies and outputs information from the operation conditions register even though it does not support a low voltage operation. However, the validity of transmission/reception of the operation conditions register information cannot be guaranteed because the card operates by a voltage which it does not support. For this reason, the host device attempts initialization of the inserted card and in the case where the initialization fails to know that the card does not support the low voltage operation.

Note that when the conventional host device that supplies high voltage and the two-voltage card are used together, there is no particular problem because both can operate at high voltage.

Figure 1:
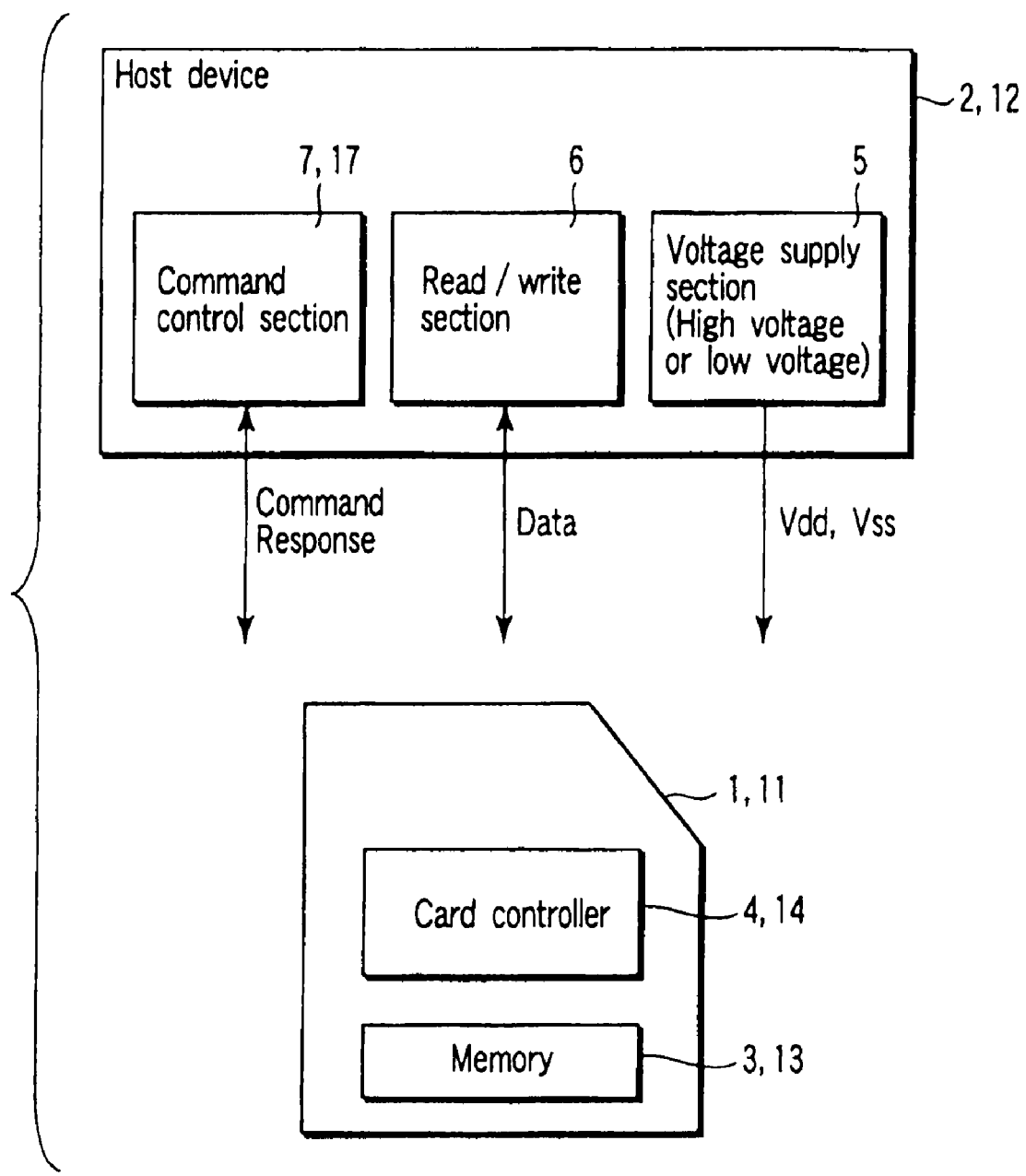
FIG. 1 is a diagram schematically showing the main parts of a card and a host device according to a first embodiment of the present invention.

FIG. 1 schematically shows the main parts of the card and host device according to the first embodiment of the invention. As shown in FIG. 1, the card 1 includes a memory 3 and a card controller 4.

The card 1 supports only a high voltage operation (for example, 3.3 V) or supports both high voltage and low voltage operations (for example, 1.8 V). Note that low voltage operation refers, in reality, that the card 1 and the host device 2 are configured to support a voltage range including 1.8 V (such as 1.65 V to 1.95 V). Similarly, the high voltage operation refers that the card 1 and the host device 2 are configured to support a voltage range including 3.3 V (such as 2.7 V to 3.6 V). Typically, the range of the operating voltage itself is the same for both the card 1 and the host device 2. An unused voltage region is provided between the low voltage range and the high voltage range.

The host device 2 includes a voltage supply section 5, a read/write section 6, and a command control section 7. The voltage supply section 5 operates with a high voltage or low voltage power source potential Vdd, and the power source potential Vdd and a common potential Vss are supplied to the card. The read/write section 6 reads data from the card 1 and writes data onto the card 1. The command control section 7 transmits and receives commands and responses to and from the card 1. Reference numerals 11, 12, 13, 14 and 17 will be explained in a second embodiment.

Figure 2:
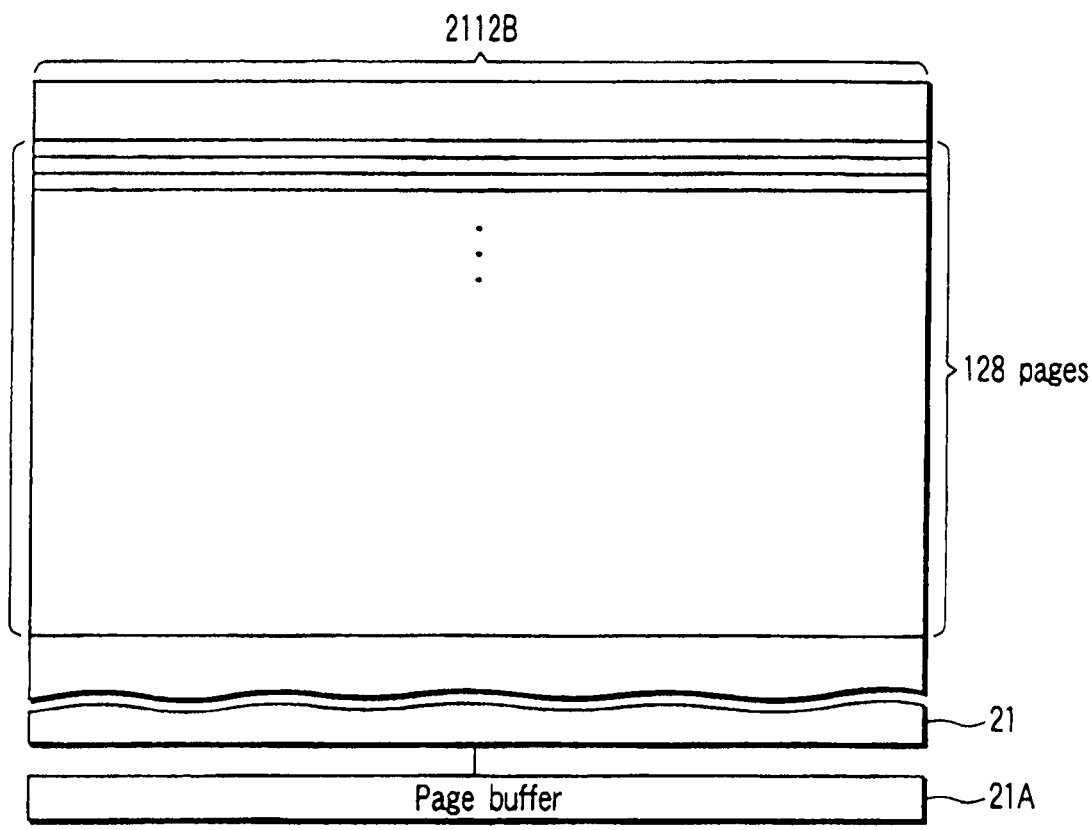
FIG. 2 is a diagram showing data arrangement of a NAND type flash memory in the memory card according to the first embodiment.

A NAND type flash memory may be used as the memory 3. FIG. 2 shows arrangement of data in the NAND type flash memory. Each page of the NAND type flash memory 11 has 2122 Bytes ((512 Bytes data memory section+16 Bytes redundant section)×4), and 128 pages form one erasure unit (256 kBytes+8 kBytes).

In addition, the NAND type flash memory 21 has a page buffer 21A for inputting and outputting data into and from the flash memory. The memory capacity of the page buffer 21A is 2112 Bytes (2048 Bytes+64 Bytes). At the time of data writing and the like, the page buffer 21A performs processing of inputting and outputting data into and from the flash memory in 1 page units corresponding to its own capacity.

When the memory capacity of the NAND flash memory 21 is, for example, 1 Gbit, the number of 256-kByte blocks (erasure units) is 512. In addition, the NAND flash memory 21 is manufactured by using, for example, 0.09-μm process technology. That is, the design rule of the NAND type flash memory 21 is less than 0.1 μm.

Meanwhile, the embodiment shows the case where the erasure unit is a 256-kByte block, but construction such that the erasure unit is, for example, a 16-kByte block is also advantageous in practical use. In this case, each page has 528 Bytes ((512 Bytes data memory section+16 Bytes redundant section), and 32 pages form one deletion unit (16 kBytes+0.5 kBytes (k is 1024). In addition, the NAND flash memory 21 may be a binary memory which stores 1 bit of information in one memory cell, or may be a multi-value memory which stores 2 bits or more of information in one memory cell.

Figure 3:
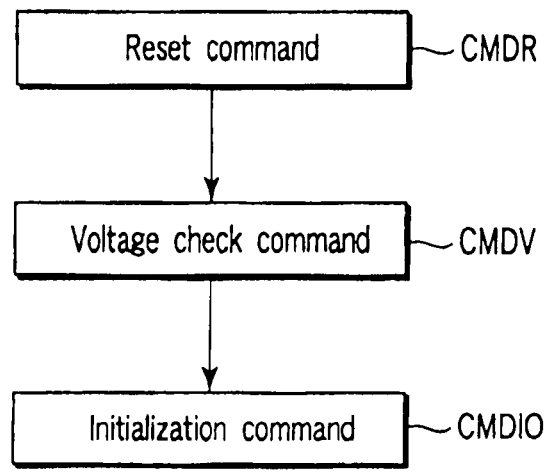
FIG. 3 shows an example of commands issued by the host device up until immediately before memory initialization.

Next, the initialization method using the card 1 and the host device 2 in FIG. 1 will be described with reference to FIGS. 3 to 7. The initialization process includes various processings. First, an outline of commands issued by the host device 2 up until immediately before memory initialization will be described. FIG. 3 shows an example of the commands issued by the host device 2 up until immediately before memory initialization. Note that the card 1 and the memory 2 operates with the operating voltage until information is acquired from the operation conditions register of the memory 2 by a memory initialization command described hereinafter. During this time, the card 1 must be operable by the operating voltage.

As shown in FIG. 3, when initialization is started, the host device 2 issues a reset command CMDR to reset circuits in the card 1.

Next, the host device 2 issues a voltage check command CMDV. The command is a newly introduced command in this embodiment. For this reason, the conventional card 1 does not recognize the voltage check command CMDV, and even if it receives this command, it does not send back a response to the host device 2. The host device 2 and the card 1 can check the operating voltage (operating voltage range) supported by each other using the voltage check command CMDV. The reciprocal checking method will be described in detail hereinafter.

Next, if the card 1, for example, supports various I/O functions that are expanded from a data storage function, the host device 2 issues an initialization command CMDIO to the card 1. Subsequently, an initialization command for the memory 1 is supplied. Memory initialization will be described using the second embodiment.

Figure 4:
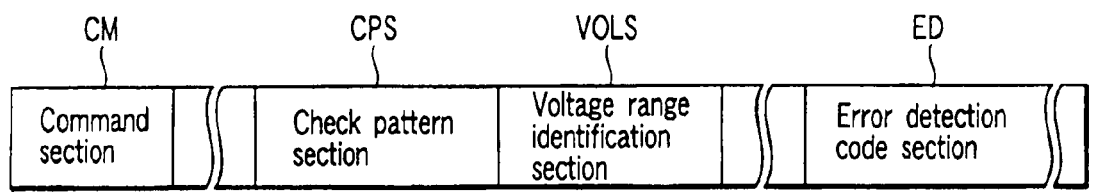
FIG. 4 is a diagram showing the main parts of the content of a voltage check command.

Now, the voltage check command CMDV will be described. FIG. 4 shows the main parts of the content of the voltage check command CMDV. As shown in FIG. 4, the voltage check command CMDV has at least a check pattern section CPS and a voltage range identification section VOLS. The voltage range identification section VOLS has a pattern which uniquely shows whether the host device 2 supports a low voltage operation or a high voltage operation.

The check pattern section CPS and the voltage range identification section VOLS can have any number of bits. However, it is preferable that the following conditions are satisfied. Namely, as described in the following, the operation of the host device 2 and the card 1 examine whether the bit pattern of the voltage range identification section VOLS match or not to check the operating voltage range for each other. For this reason, the check pattern section CPS may be, for example, about 8 bits and the voltage range identification section VOLS may be, for example, about 4 bits in order to avoid incorrect recognition when the pattern for this section changes due to noise. The command section CM has an index for identifying this command.

In order to check whether or not the command is correctly transmitted from the host device 2 to the card 1, the voltage check command CMDV has an error detection code section ED which uses an error detection code section ED using an error detection code or the like such as CRC (Cycle Redundancy Check). The card 1 can detect an error inside the voltage check command CMDV by using the error detection code.

Figure 5:
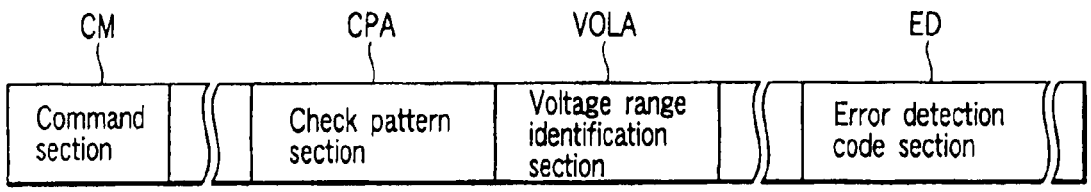
FIG. 5 is a diagram showing the main parts of the content of a response to the voltage check command.

FIG. 5 shows the main parts of the content of a response to the voltage check command CMDV. As shown in FIG. 5, the response to the voltage check command includes at least a check pattern section CPA and a voltage range identification section VOLA. The card 1 forms the same bit pattern as the voltage check command CMDV in the check pattern section CPA, and forms the same bit pattern as the voltage range identification section VOLS in the voltage range identification section VOLA to thereby send a response to the host device. The response may have an error detection code section ED as in the case of the voltage check command CMDV. The host device 2 can use the error detection code or compare the response with the command to determine if they match in order to detect errors in the response of the voltage check command CMDV.

Next, description will be given to a method in which the host device 2 and the card 1 check the operating voltage range which each other supports by using the voltage check command CMDV. The process differs depending on a high voltage range operation or a low voltage range operation. First, the process of the high voltage range operation will be described. FIG. 6 is a flowchart showing a process for checking the operating voltage range when the host device 2 operates in the high voltage range. As shown in FIG. 6, the host device 2 issues the voltage check command CMDV to the card 1 in step ST1.

In step ST2, the host device 2 determines whether or not there is a response to the voltage check command CMDV. As described above, the conventional card does not recognize the voltage check command CMDV, and thus does not issue a response to the command. For this reason, the host device 2 determines that the card 1 is not a low voltage card, or in other words, it determines that the process by the high voltage operation can be continued, and takes the memory initialization process. The memory initialization process will be described in the second embodiment.

Meanwhile, when the card 1 under initialization is the card of this embodiment, the card 1 sends back the response shown in FIG. 5 to the host device 2. At this step, the card 1 first observes a bit pattern of the voltage range identification section VOLS of the voltage check command CMDV. Then, the card 1 sends back the response which has the same bit pattern as this bit pattern in the voltage range identification section VOLA.

Next, in step ST3, the host device 2 checks the matching of the pattern of the voltage range identification section VOLA in the response and the pattern of the voltage range identification section VOLS in the voltage check command CMDV. When these pattern match, the host device 2 determines that the card 1 is a new card for which the voltage check command CMDV can be checked and that the operating voltage range of the host device 2 is supported.

Simultaneously, the host device 2 executes CRC check or checks that the bit pattern of the response matches the bit pattern of the command. Consequently, it can be confirmed that the transmission and reception of the voltage check command CMDV are reliable.

In the case of a bus mode with an error detection code in a command, the pattern of the error detection code section ED in the response is formed into, for example, a CRC code to check the validity of the response. In the case of a bus mode without error detection code section ED in the voltage check command CMDV, the voltage range identification section VOLS and the voltage range identification section VOLA as well as the check pattern sections CPS and CPA of the command and response respectively match, and the response is determined to be normal. If the response is determined to be normal, the voltage check process ends. Then, the flow transfers to the memory initialization process. This will be described in the second embodiment.

On the other hand, if the voltage range identification section VOLS and the voltage range identification section VOLA do not match and/or the check pattern section CPS and the check pattern section CPA do not match, and an error is detected by the error detection code, the process for checking the operating voltage range ends. As a result, the initialization process stops.

FIG. 7 is a flowchart showing a process for checking the operating voltage range when the operating voltage of the host device 2 is within the low voltage range. The difference between the low voltage operation and the high voltage operation lies only in the following point. Namely, if there is no response from the card 1 in step ST2, this means that the card 1 does not operate with low voltage. Thus, the initialization process stops in order to avoid initialization on the high voltage card by the host device 2 that operates in the low voltage range.

According to the card 1 and the host device 2 of the first embodiment of the invention, the card 1 and the host device 2 can know the operating voltage range that each other supports based on transmission/reception of the newly provided command. For this reason, the subsequent initialization process can be performed by normal operation using the operating voltage range that the card 1 and the host device 2 both support. In addition, when the operating voltage range that both support do not match, the host device 2 can detect this and cancel the initialization process. As a result, it is possible to avoid wasteful process such as initialization in an abnormal state and a malfunction of the host.

In addition, according to the first embodiment, the voltage check command CMDV has a check pattern, and the card 1 forms the same pattern as the check pattern in the response to the voltage check command CMDV. Comparing the check patterns can provide guarantee of the reliability of transmission and reception of the voltage check command CMDV. Accordingly, even when the bus mode without code error detection section in each command, errors can be detected in the response.

(Second Embodiment)

A second embodiment relates to a method of memory initialization depending on whether a memory loaded in a card is of a large capacity or a small capacity.

With the realization of a card capable of storing large volume of information (large capacity card), it is necessary to newly set a format corresponding to the large capacity card. A file system of a new format is different from that of a conventional low capacity format. In addition, a conventional host device which uses the low capacity format cannot recognize the file system of the large capacity card. For this reason, if the conventional host device initializes the large capacity card, data on the card may be destroyed.

The following four combinations are possible according to whether or not the host device supports large capacity and whether or not the card that is being initialized supports large capacity.
(1) Conventional host device (which does not support large capacity)+small capacity card
(2) Conventional host device+large capacity card
(3) Large capacity supporting host device (also supports small capacity)+small capacity card
(4) Large capacity supporting host device+large capacity card.

It is desirable that the host device and/or the card detect which of the above cases applies and responds accordingly.

As shown in FIG. 1, a card 11 according to the second embodiment of the invention is loaded with a small capacity or large capacity memory 13 and a card controller 14. A host device 12 includes a command control section 17. The command control section 17 is configured to support a memory initialization command of the second embodiment described and both the small capacity card and the large capacity card as well as the functions of the command control section 7 of the first embodiment.

The content of the memory initialization command differs depending on where the process reaches in the flowchart of the first embodiment. If the results of the operating voltage range checking determines that the process has reached A in FIG. 6, the host device 12 has a function for issuing the voltage check command CMDV and is thus not a conventional format, or in other words, it supports large capacity. In addition, the case in which the card being initialized is a small capacity card, the case (3) above is applicable. In this case, the host device 12 issues a conventional memory initialization command. The card controller 14 of the card 1 receives the conventional memory initialization command to initialize the memory into a mode that is compatible with the prior art.

Figure 8:
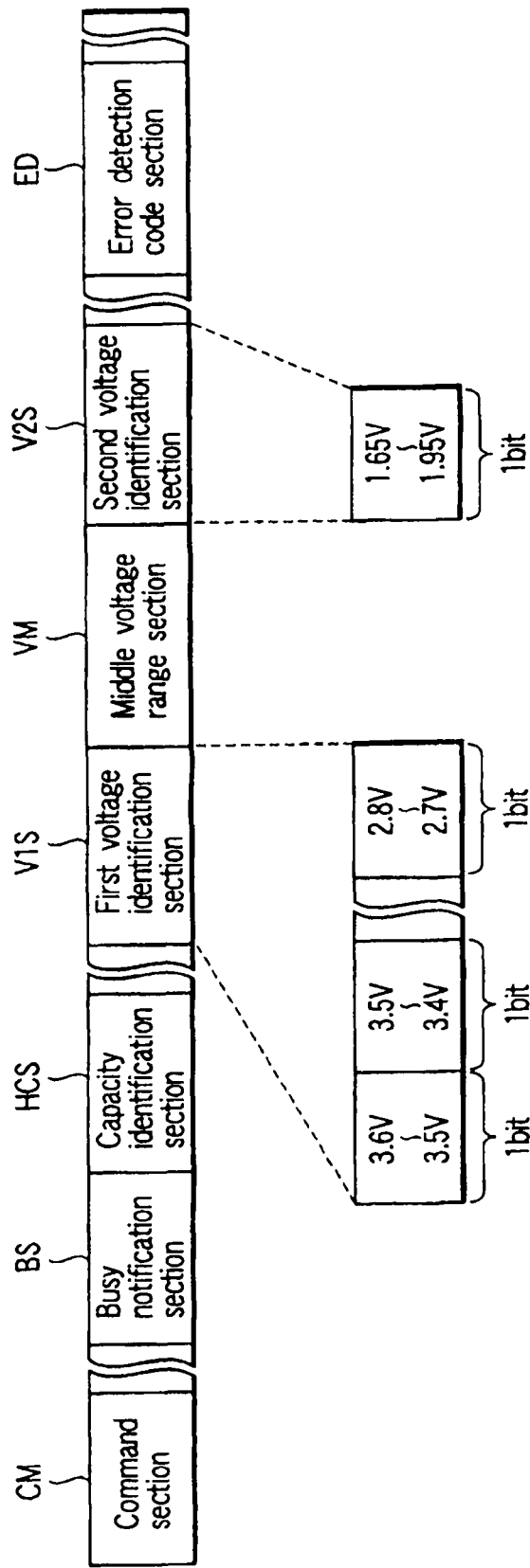
FIG. 8 is a diagram showing the main parts of the content of a memory initialization command according to a second embodiment of the present invention.

On the other hand, in the case where the process reaches B in FIG. 6 or FIG. 7, the host device 12 performs memory initialization by using a new initialization command shown hereinafter. FIG. 8 shows the main parts of the content of the new memory initialization command according to the second embodiment of the invention. As shown in FIG. 8, the memory initialization command includes a first voltage identification section V1S, a second voltage identification section V2S, a capacity identification section HCS, and a busy notification section BS. The second voltage identification section V2S may be omitted, and only the first voltage identification section V1S may be defined.

The first voltage identification section V1S is configured by, for example, multiple bits, and each bit corresponds to a specific width of voltage (such as 0.1 V). A voltage range supported by the first voltage identification section V1S is the same as the high voltage operation range of the first embodiment. A bit showing the voltage being currently applied at the host device 12 is set to "1".

The second voltage identification section V2S may be configured by 1 bit. It may also be formed of a plurality of bits. The bit is set if the host device 12 applies voltage in the low voltage range. When the second voltage identification section V2S is configured by multiple bits, the width of the voltage covered by each bit in the second voltage identification section V2S can be less than that for the first voltage identification section V1S, and may be unit of 0.05 V, for example. By doing this, even if the operating voltage of the host device and the card is decreased even further in the future, the host device can show its own operating voltage in more detail. A voltage range supported by the second voltage identification section V2S is the same as the low voltage range of the first embodiment.

A middle voltage range section VM is provided between the voltage range covered by the first voltage identification section V1S and the voltage range covered by the second voltage identification section V2S. The host device 12 does not support the voltage range corresponding to the middle voltage range section VM, and as a consequence, all of the bits in the middle voltage range section VM never show "1".

The following advantages are obtained by providing the middle voltage range section VM. The card controller 14 has a voltage regulator in order that the card 11 can correspond to two operating voltage ranges. The voltage regulator determines whether a supply voltage from the host device 12 is high voltage or low voltage, and changes the supply voltage to the operating voltage of the card 11. At this time, if two operating voltage ranges are successive, the voltage regulator finds it difficult to determine a voltage which is substantially in the middle of the two operating voltage ranges. As a result, the operation slowly progresses. To avoid that, a region that is not for use is provided to help the voltage regulator easily determine the range of the supply voltage.

The capacity identification section HCS has a pattern which indicates whether the host device 12 supports only small capacity or both small capacity and large capacity. The busy notification section BS is set to 0 or 1 in the response, and is constant (for example, 0) in the command. The new memory initialization command may have an error detection section ED composed of a CRC code and the like.

Figure 9:
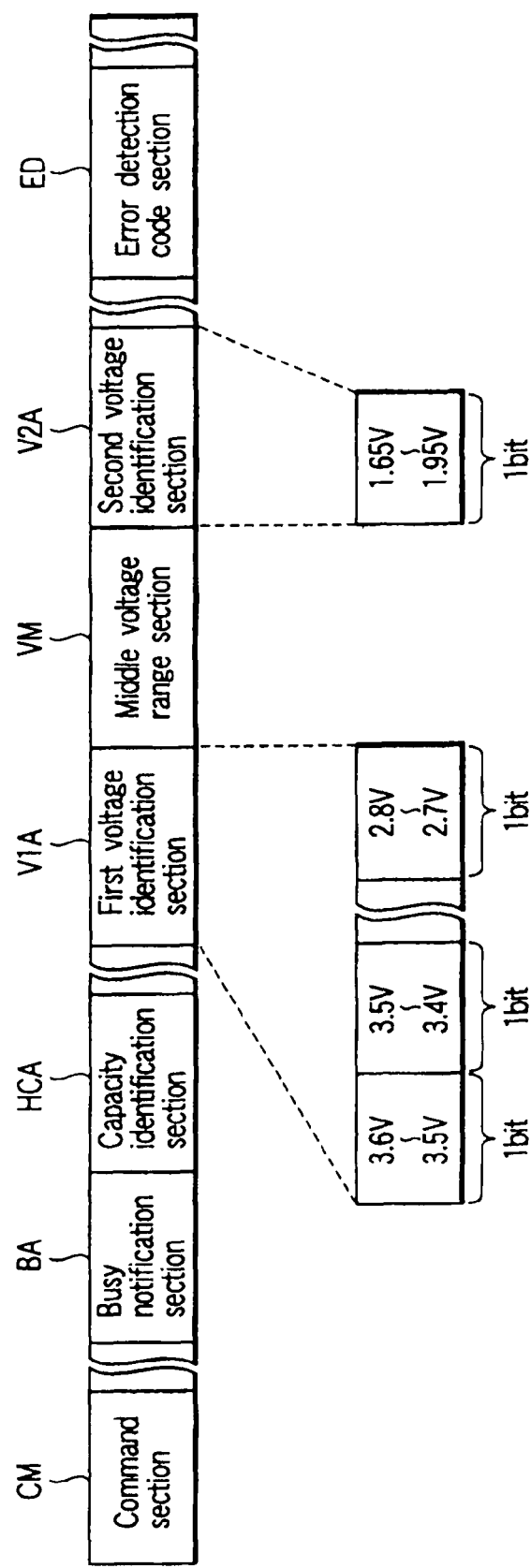
FIG. 9 is a diagram showing the main parts of the content of a response to the memory initialization command according to the second embodiment.

FIG. 9 shows the main parts of the content of the response of the memory initialization command according to the second embodiment. As shown in FIG. 9, each part of the response of the memory initialization command has the same format as the command, and includes a first voltage identification section V1A, a second voltage identification section V2A, a capacity identification section HCA, and a busy notification signal BA.

The first voltage identification section V1A has the same number of bits as the first voltage identification section V1S in the command, and all of the bits corresponding to the operating voltage that the card 11 itself supports may be, for example, "1".

Similarly, the second voltage identification section V2A also has the same number of bits as the second voltage identification section V2S in the command. All of the bits corresponding to the operating voltage that the card 11 itself supports may be, for example, "1".

The capacity identification section HCA indicates whether the card 11 is a small capacity card or a large capacity card. The busy notification section BS forms a bit pattern during the memory initialization, the bit pattern indicating this fact.

Figure 10:
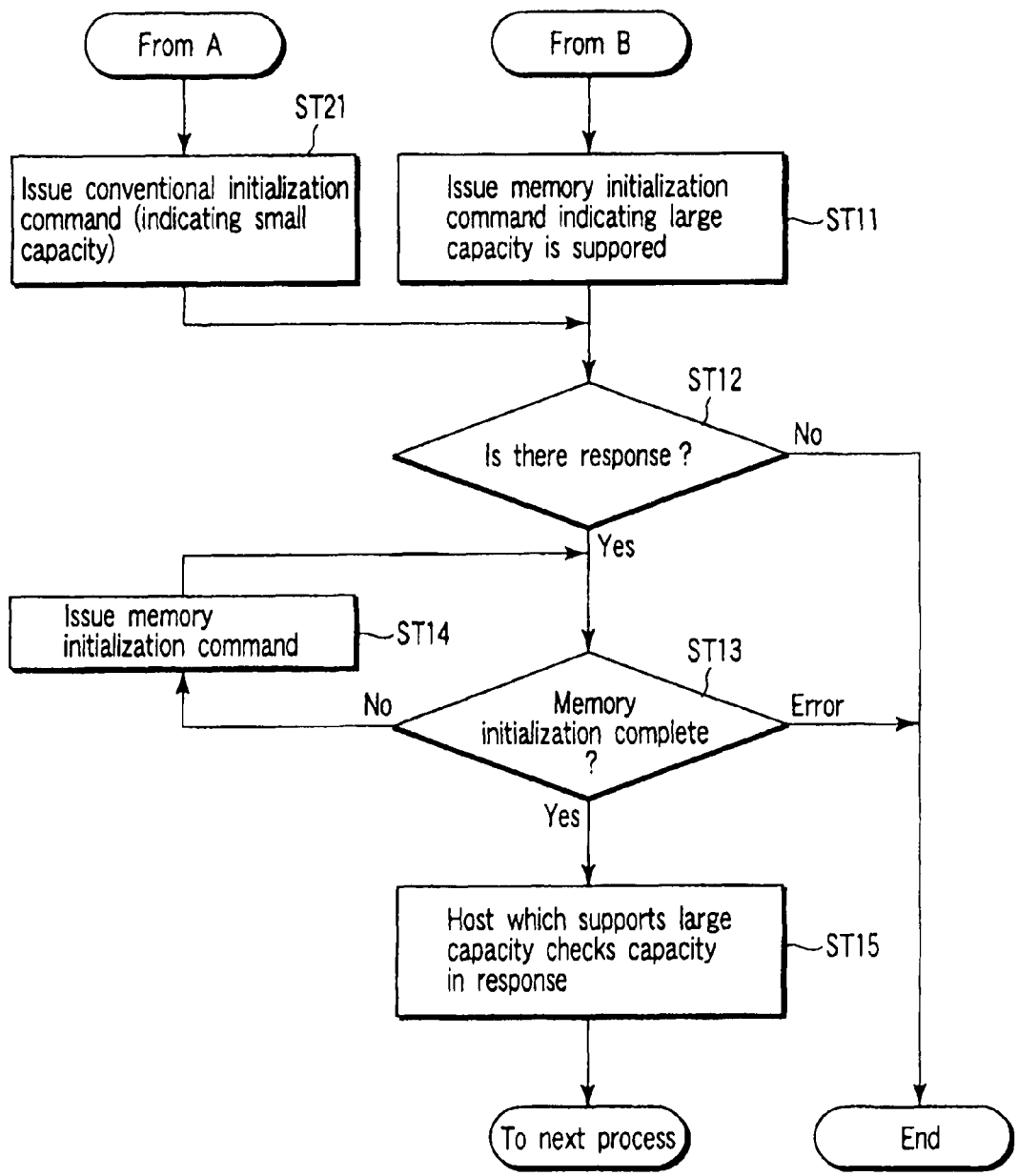
FIG. 10 is a flowchart showing a memory initialization process according to the second embodiment of the invention.

Next, the method for memory initialization will be described with reference to FIG. 10. FIG. 10 is a flowchart showing the memory initialization process according to the second embodiment of the invention. FIG. 10 shows the portion following A and B in FIGS. 6 and 7. That at least both the card 11 and the host device 12 support issuing the voltage check command CMDV is necessary to issue a new memory initialization command. In addition, when the card 11 is a large capacity card, the new memory initialization command must be issued.

As shown in FIG. 10, in step ST11, the host device 12 issues a new memory initialization command shown in FIG. 8. If the host device 12 supports a large capacity card, the capacity identification section HCS of this command is set to a bit pattern that indicates that the host device 12 supports a large capacity card.

Note that when the host device is a conventional type, the voltage check command CMDV and the memory initialization command (new memory initialization command) according to this embodiment are not issued. In addition to it, when the card being initialized is a small capacity card, which corresponds to (1) above, the card 11 is initialized (including the operation of the card 11 sending back a response) in a mode that is compatible with the prior art by means of the conventional initialization command.

When the host device is the conventional type, and the card 11 that being initialized is a large capacity card, which corresponds to (2) above, the card 11 which has not received the voltage check command CMDV does not complete initialization instructed by the memory initialization command in order to cancel the initialization process. The host device, then, detects that the initialization could not be performed based on a time limit check. This makes it possible to prevent initialization of the large capacity card by the small capacity format in error.

Next, in step ST12, the host device 12 determines existence of a response to the new memory initialization command. When no response is received, it is assumed that an error occurred and the processing ends. When a response is received, the host device 12 checks in step ST13 the bit pattern of the busy notification section BA in the response. The host device 12 keep issuing the memory initialization command until the initialization of the memory ends and the bit pattern indicates that memory initialization has ended (step ST14). Once initialization of the memory 13 starts, the card only sends back a response and ignores the content that has been set in the memory initialization command parameters. The host device 12 checks the limits for the time for which the memory 13 is being initialized.

When the initialization of the memory 13 is complete, the host device 12 checks the bit pattern of the capacity identification section HCA in the response in step ST15. The capacity identification section HCA comes in effect when initialization ends. If the card 11 being initialized is a new card and of a small capacity card, HCA=0 is shown, which corresponds to the case (3) above. As a result, the host device 12 knows that the card has been initialized as a small capacity card. If it is a large capacity card, HCA=1 is shown, which corresponds to the case (4) above. As a result, the host device 12 knows that the card has been initialized as a large capacity card. The process, then, transfers to an additional process (for example, acquisition of an ID of the card 11).

In the host device 12 and the card 11 according to the second embodiment of the invention, the memory initialization command and response includes support information and identifying information for the small capacity card or the large capacity card. The host device 12 and the card 11 use it to check whether a host device with which it is in communication supports large capacity. The high capacity card 11 is initialized only when both the host device 12 and the card 11 support high capacity. The small capacity card is initialized only when both the host device 12 and the card 11 support small capacity. Also, because the host device 12 which supports large capacity must also support small capacity, the initialization process is cancelled when the small capacity host attempts to initialize the large capacity card 11. Consequently, even when the new or old host devices are used with the new or old cards, errors in operation can be prevented.

In addition, various modifications and adjustments within the scope of the present invention may occur to one skilled in the art, and it is to be understood that these modifications and adjustments are included in the scope of the invention.

According to the present invention, a card and a host device can be provided, in which reciprocal checking of the operating voltage and capacity is possible.

What is claimed is:

1. A memory device comprising:
a memory and a controller to control the memory, wherein upon reception of an initialization command which instructs initialization of the memory device and includes a first capacity identification section which indicates whether host supports only a small capacity format or both the small capacity format and a large capacity format, the memory device:
  performs the initialization of the memory device when the memory device receives the initialization command after issuing a response to a first command and the first capacity identification section indicates that the host supports both the small capacity format and the large capacity format,
  does not complete the initialization of the memory device when the memory device receives the initialization command without receiving the first command before reception of the initialization command, and
  does not complete the initialization of the memory device when the memory device receives the initialization command after issuing a response to the first command and the first capacity identification section indicates that host supports only the small capacity format.

2. The memory device of claim 1, wherein
the first command includes a voltage range identification section which indicates a range of supply voltage supplied by a host device.

3. The memory device of claim 1, wherein
the memory device issues, in response to the initialization command, a response indicating a busy status whether memory device is performing the initialization or completed the initialization.

4. The memory device of claim 3, wherein
the second capacity identification section in the response is effective when the busy status indicates completion of the initialization.

5. The memory device of claim 3, wherein
the memory device notifies initialization failure by keeping the busy status on performing initialization and a host device detects incompletion of the initialization through time out of the busy status.

6. The memory device of claim 1, wherein
the memory device issues, in response to the initialization command, a response which includes a second capacity identification section which indicates the large capacity format.

7. A memory device comprising:
a memory and a controller to control the memory, wherein the memory device performs initialization of the memory device when the memory device receives an initialization command which instructs initialization of the memory device without receiving a first command before reception of the initialization command, and
the memory device performs initialization of the memory device regardless of a first capacity identification section when the memory device receives an initialization command which instructs initialization of the memory device and includes a first capacity identification section which indicates whether host supports only a small capacity format or both the small capacity format and a large capacity format after receiving the first command regardless of the memory device responses to the first command.

8. The memory device of claim 7, wherein
the first command includes a voltage range identification section which indicates a range of supply voltage supplied by a host device.

9. The memory device of claim 7, wherein
the memory device issues, in response to the initialization command, a response indicating a busy status whether the memory device is performing the initialization or completed the initialization.

10. The memory device of claim 7, wherein
the memory device issues, in response to the initialization command, a response which includes a second capacity identification section which indicates the memory device has been initialized with the small capacity format.

11. The memory device of claim 10, wherein
the second capacity identification section in the response is effective when the busy status indicates completion of the initialization.

* * * * *